United States Patent [19]

Bakhmutsky

[11] Patent Number: 5,668,548
[45] Date of Patent: Sep. 16, 1997

[54] HIGH PERFORMANCE VARIABLE LENGTH DECODER WITH ENHANCED THROUGHPUT DUE TO TAGGING OF THE INPUT BIT STREAM AND PARALLEL PROCESSING OF CONTIGUOUS CODE WORDS

[75] Inventor: Michael Bakhmutsky, Spring Valley, N.Y.

[73] Assignee: Philips Electronics North America Corp., New York, N.Y.

[21] Appl. No.: 580,405

[22] Filed: Dec. 28, 1995

[51] Int. Cl.[6] ............................................. H03M 7/40
[52] U.S. Cl. ............................. 341/67; 341/63; 341/106
[58] Field of Search ............................ 341/67, 100, 106, 341/65, 63

[56] References Cited

U.S. PATENT DOCUMENTS

| | | | |
|---|---|---|---|
| 5,173,695 | 12/1992 | Sun et al. | 341/67 |
| 5,363,097 | 11/1994 | Jan | 341/67 |

FOREIGN PATENT DOCUMENTS

| | | |
|---|---|---|
| 0614317 | 9/1994 | European Pat. Off. |
| 0631440 | 12/1994 | European Pat. Off. |

Primary Examiner—Todd DeBoer
Attorney, Agent, or Firm—Laurie E. Gathman

[57] ABSTRACT

A high performance variable length decoder which includes a tagging circuit that tags the boundaries of code words in an incoming bit stream, providing a tag stream output and a bussed bit stream output that coincides in time with the tag stream output. The bussed tag stream output is connected to an input of a high speed parallel word length computation circuit, and the bussed bit stream output is connected to an input of a parallel value decoder circuit. The parallel word length computation circuit (word length decoding loop) receives the bussed tag stream and computes (decodes) the length of a singular code word in a singular mode of operation, or the lengths of one or more contiguous code words in a contiguous mode of operation. The word length computation circuit uses faster type independent look-up tables for decoding the lengths of the code words represented by the bussed tag stream, thereby enabling much faster word length decoding for the overwhelming majority of code words in the incoming bit stream. The word type independent decoding operation increases the degree of parallelism in processing, and therefore the throughput of the variable length decoder that can be achieved at lower clock rates. The parallel value decoder circuit receives the bussed bit stream from the tagging circuit and decodes the values of a singular code word in a first or singular mode of operation, or one or more contiguous code words in parallel in a second or contiguous mode of operation. The mode of operation (either singular or contiguous) is selected in accordance with a control signal generated by a control circuit which controls the operation of the variable length decoder on the basis of current and previously decoded code words, in accordance with a prescribed decoding protocol, e.g. an MPEG protocol.

25 Claims, 4 Drawing Sheets

FIG. 5

| CODE WORD | DCT COEFFICIENT BLOCK 1 | | | | | DCT COEFFICIENT BLOCK 2 | | | | | DCT COEFFICIENT BLOCK 3 | | | | | DCT COEFFICIENT BLOCK 4 | | | | |
|---|---|---|---|---|---|---|---|---|---|---|---|---|---|---|---|---|---|---|---|---|
| | DC | AC1 | AC2 | AC3 | AC4 | EOB | DC | AC1 | AC2 | EOB | DC | AC1 | AC2 | EOB | DC | AC1 | AC2 | AC3 | AC4 | EOB |
| CLOCK CYCLE | 1 | | 2 | | 3 | | 4 | | 5 | | 6 | | 7 | | 8 | | 9 | | | 10 X |

FIG. 6

| CODE WORD | DCT COEFFICIENT BLOCK 1 | | | | | DCT COEFFICIENT BLOCK 2 | | | | | DCT COEFFICIENT BLOCK 3 | | | | | DCT COEFFICIENT BLOCK 4 | | | | |
|---|---|---|---|---|---|---|---|---|---|---|---|---|---|---|---|---|---|---|---|---|
| | DC | AC1 | AC2 | AC3 | AC4 | EOB | DC | AC1 | AC2 | EOB | DC | AC1 | AC2 | EOB | DC | AC1 | AC2 | AC3 | AC4 | EOB |
| CLOCK CYCLE | 1 | 2 | 3 | 4 | 5 | 6 | 7 | 8 | 9 | 10 | 11 | 12 | 13 | 14 | 15 | 16 | 17 | 18 | 19 |

FIG. 7

| CODE WORD | DCT COEFFICIENT BLOCK 1 | | | | | DCT COEFFICIENT BLOCK 2 | | | | | DCT COEFFICIENT BLOCK 3 | | | | | DCT COEFFICIENT BLOCK 4 | | | | | |
|---|---|---|---|---|---|---|---|---|---|---|---|---|---|---|---|---|---|---|---|---|---|
| | DC | AC1 | AC2 | AC3 | AC4 | EOB | DC | AC1 | AC2 | EOB | DC | AC1 | AC2 | EOB | DC | AC1 | AC2 | AC3 | AC4 | EOB | OTHER |
| CLOCK CYCLE | 1 | 2 | 3 | 4 X | 5 O | | 6 | 7 O | 8 | 9 X | 10 O | | 11 | 12 | | | 13 X | 14 O |

HIGH PERFORMANCE VARIABLE LENGTH DECODER WITH ENHANCED THROUGHPUT DUE TO TAGGING OF THE INPUT BIT STREAM AND PARALLEL PROCESSING OF CONTIGUOUS CODE WORDS

BACKGROUND OF THE INVENTION

The present invention relates generally to variable length decoders used in data transmission systems, and more particularly, to a variable length decoder for decoding digital video data for high definition television (HDTV).

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, however, where the peak symbol rate is about 100 million code words per second, decoding the whole picture at the symbol rate with a single variable length decoder becomes impractical. In HDTV systems, the variable length decoder (VLD) is used to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol, a VLD throughput of 100 million or more code words per second is required. In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs requires eight ping-pong buffers, each one of the ping-pong buffers being twice the size of the rate buffer, thereby increasing the amount of required buffer memory by a factor of sixteen over a system having a single VLD.

In HDTV systems, the input bit stream is an MPEG digital video data stream which includes payload data and setup data. The payload data, which constitutes the overwhelming majority of the data (about 95% of the data), is represented by contiguous code words such as DCT (discrete cosine transform) coefficients and motion vectors, which are decoded using their respective look-up tables. The setup data, which constitutes the remaining portion of the data (about 5% of the data), is represented by singular code words which are decoded using different look-up tables.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data, but at a lower clock rate, thereby enabling the use of cheaper (slower) memory and making more practical the implementation of the variable length decoder.

To fulfill this need in the art, and increase the data throughput, a variable length decoder capable of parallel processing of code words was developed and disclosed in a co-pending U.S. patent application entitled "Variable Length Decoder with Enhanced Throughput due to Parallel Processing of Contiguous Code Words of Identical Type," by M. Bakhmutsky, the teachings of which are herein incorporated by reference. With the variable length decoder disclosed in the above-referenced application, the amount of code words that can be processed in parallel depends on the type and sequence of the code words in the input bit stream. As a result, the amount of parallel processing that can be done in a given clock cycle is limited by the number of contiguous code words which occur in that given clock cycle. In addition, the standard progagation delays through the word length computation loop comprised of a plurality of barrel shifters, a plurality of variable word length decoders which use conventional Huffman look-up tables, and a plurality of adders, still exist, and thereby limit the data throughput which can be achieved.

Hence, a need exists in the art for an improved variable length decoder with adaptations for optimizing word length computation and parallel processing operations in order to enhance data throughput per clock cycle, at a lower clock rate.

SUMMARY OF THE INVENTION

The need in the art is addressed by the high performance variable length decoder of the present invention. In the illustrative embodiment, the variable length decoder includes a tagging circuit that tags the boundaries of code words in an incoming bit stream, providing a bussed tag stream output and a bussed bit stream output that coincides in time with the bussed tag stream output. The bussed tag stream output is connected to an input of a high speed parallel word length computation circuit, and the bussed bit stream output is connected to an input of a parallel value decoder circuit.

The parallel word length computation circuit (word length decoding loop) receives the bussed tag stream and computes (decodes) the length of a singular code word in a singular mode of operation, or the lengths of one or more contiguous code words in a contiguous mode of operation. The word length computation circuit uses faster type independent look-up tables for decoding the lengths of the code words represented by the bussed tag stream, thereby enabling much faster word length decoding for the overwhelming majority of code words in the incoming bit stream. The word type independent decoding operation increases the degree of parallelism in processing, and therefore the throughput of the variable length decoder that can be achieved at lower clock rates.

The parallel value decoder circuit receives the bussed bit stream from the tagging circuit and decodes the values of a singular code word in a first or singular mode of operation, or one or more contiguous code words in parallel in a second or contiguous mode of operation.

The mode of operation (either singular or contiguous) is selected in accordance with a control signal generated by a control circuit which controls the operation of the variable length decoder on the basis of current and previously decoded code words, in accordance with a prescribed decoding protocol, e.g., an MPEG protocol.

Thus, by both tagging the input bit stream and decoding contiguous code words in parallel, the degree of parallelism in processing which is achieved by the variable length decoder of the present invention throughput of the variable length decoder that can be achieved at lower clock rates is greatly increased.

BRIEF DESCRIPTION OF THE DRAWINGS

These and other objects, features, and advantages of the present invention will be readily understood from the following detailed description taken in conjunction with the accompanying drawings, in which:

FIG. 5 is a diagram illustrating the number of code words processed per clock cycle for an exemplary sequence of input code words, using the variable length decoder of the present invention;

FIG. 6 is a diagram illustrating the number of code words processed per clock cycle utilizing a variable length decoder constructed in accordance with the teachings of U.S. Pat. No. 5,173,695 to Sun et al., for the same exemplary sequence of input code words; and, FIG. 7 is a diagram illustrating the number of code words processed per clock cycle for the same exemplary sequence of input code words utilizing a variable length decoder constructed in accordance with the teachings of the co-pending U.S. patent application entitled "Variable Length Decoder with Enhanced Throughput due to Parallel Processing of Contiguous Code Words of Identical Type," by M. Bakhmutsky.

DETAILED DESCRIPTION OF THE INVENTION

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the present invention would be of significant utility.

Figure 1:
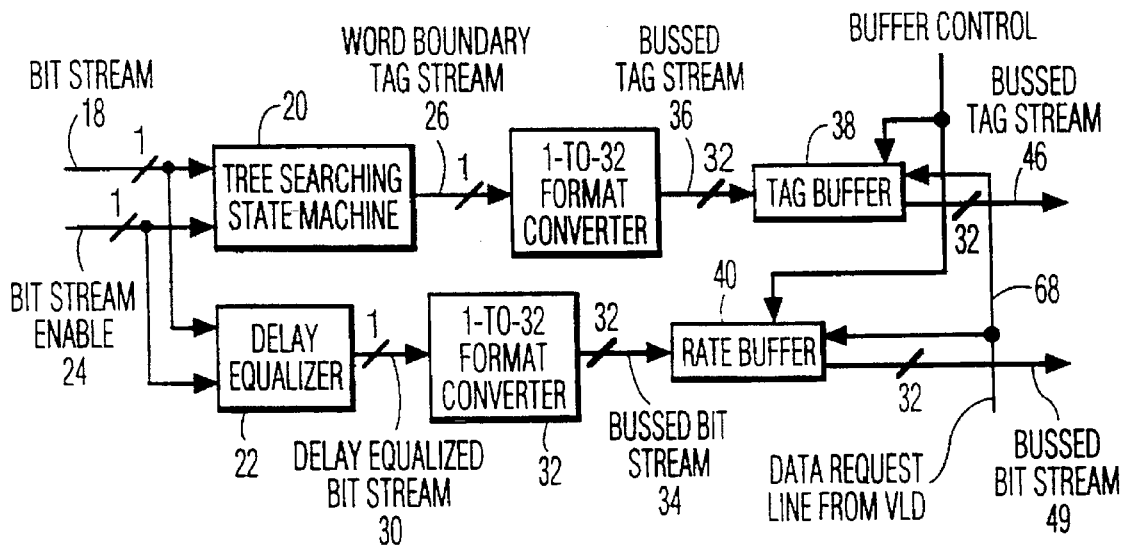
FIG. 1 is a diagram of a tag stream generation circuit that may be used as a pre-tagging circuit for the variable length decoder of the present invention.

FIG. 1 is a diagram of a tag stream generation circuit 16 that may be used as a pre-circuit for the variable length decoder of the present invention. A bit stream 18 comprised of code words of variable length is input to a tree searching state machine 20 and a delay equalizer 22. A bit stream enable signal 24 is also connected to the tree searching state machine 22 and the delay equalizer 22. The bit stream 18 supplies a stream of bits that includes sequences of code words to the tree searching state machine 20 and the delay equalizer 22. The state machine 20 and the equalizer 22 receive and process the code words in response to an "on" state of the bit stream enable signal 24. It will be readily apparent to those skilled in the art that a standard look-up decoder, a microprocessor, or any other suitable device may be used instead of the tree searching state machine 20.

The tree searching state machine 20 receives the input bit stream 18 and detects code words within the bit stream 18. The boundaries of the detected code words are tagged or marked and output from the state machine 20 as a word boundary tag stream 26. The word boundary tag stream 26 is then input to a first format converter 28. The state machine 20 delays the bit stream 18 by the time it takes the tree searching state machine 20 to tag the code word boundaries.

The delay equalizer 22 delays bits in the bit stream 18 by the same amount that the tree searching state machine 20 delays the bit stream 18. The delay equalizer 22 then outputs a delayed bit stream 30. The bit stream 30 runs parallel to the word boundary tag stream 26 and is equalized in the sense that code words in the bit stream 30 are aligned in time with the code word boundaries in the tag stream 26, as is illustrated in FIG. 2.

Figure 2:
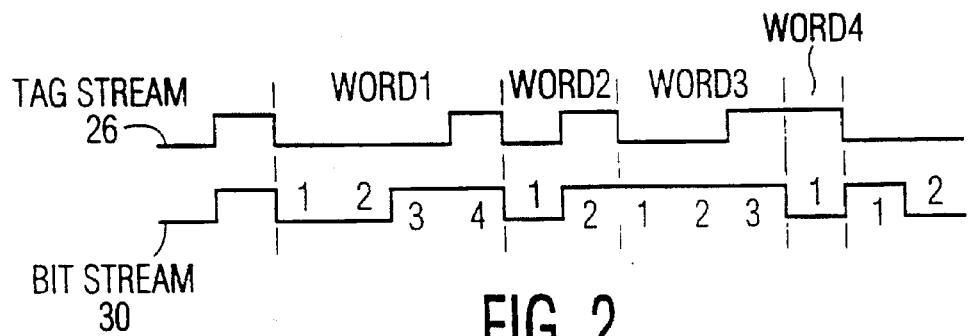
FIG. 2 is a timing diagram illustrating the timing of the tag stream generation circuit depicted in FIG. 1.

FIG. 2 is a timing diagram illustrating the timing of the tag stream generation circuit of FIG. 1. In the diagram of FIG. 2, the boundaries of code words are marked by a high state in the tag stream 26. The corresponding code words in bit stream 30 are shown aligned in time with the tag stream 26. The bits of each code word are numbered starting from one.

The first format converter 28 converts the serial tag stream 26 into a parallel thirty-two bit tag stream 36. The format-converted (parallel) tag stream 32 contains a high bit aligned to, for example, the last bit of a code word in the bit stream 30, as shown in FIG. 2. The thirty-two bit tag stream is input to a tag buffer 38 where the tags for the code words in a given image or data set are stored before being used to decode the code words.

Returning to FIG. 1, the delayed bit stream 30 is connected to a second format converter 32. The second format converter 32 converts the serial bit stream 30 into a thirty-two bit parallel bit stream 34. Of course, the bit width of the parallel bit stream 34 is not limiting to the present invention, and can be any other convenient number, as will be readily appreciated by those skilled in the pertinent art.

The thirty-two bit bussed bit stream 34 is input to a rate buffer 40 where the bits for the code words in a given image or data set are stored before being decoded. A buffer control input 42 is used to control the read and write cycles of the rate buffer 40.

Typically, for HDTV applications, an image is stored in the rate buffer 40, and the corresponding code word tags are stored in the tag buffer 38. Consequently, the image from the rate buffer 40 must be extracted and decoded during the allotted image display time. Extracting the image from the rate buffer 40 during the limited display time requires an extremely fast decoder circuit. Otherwise, the rate buffer 40 and the tag buffer 38 will not be completely decoded when the buffers 40, 38 are full, causing the system to crash.

Figure 3:
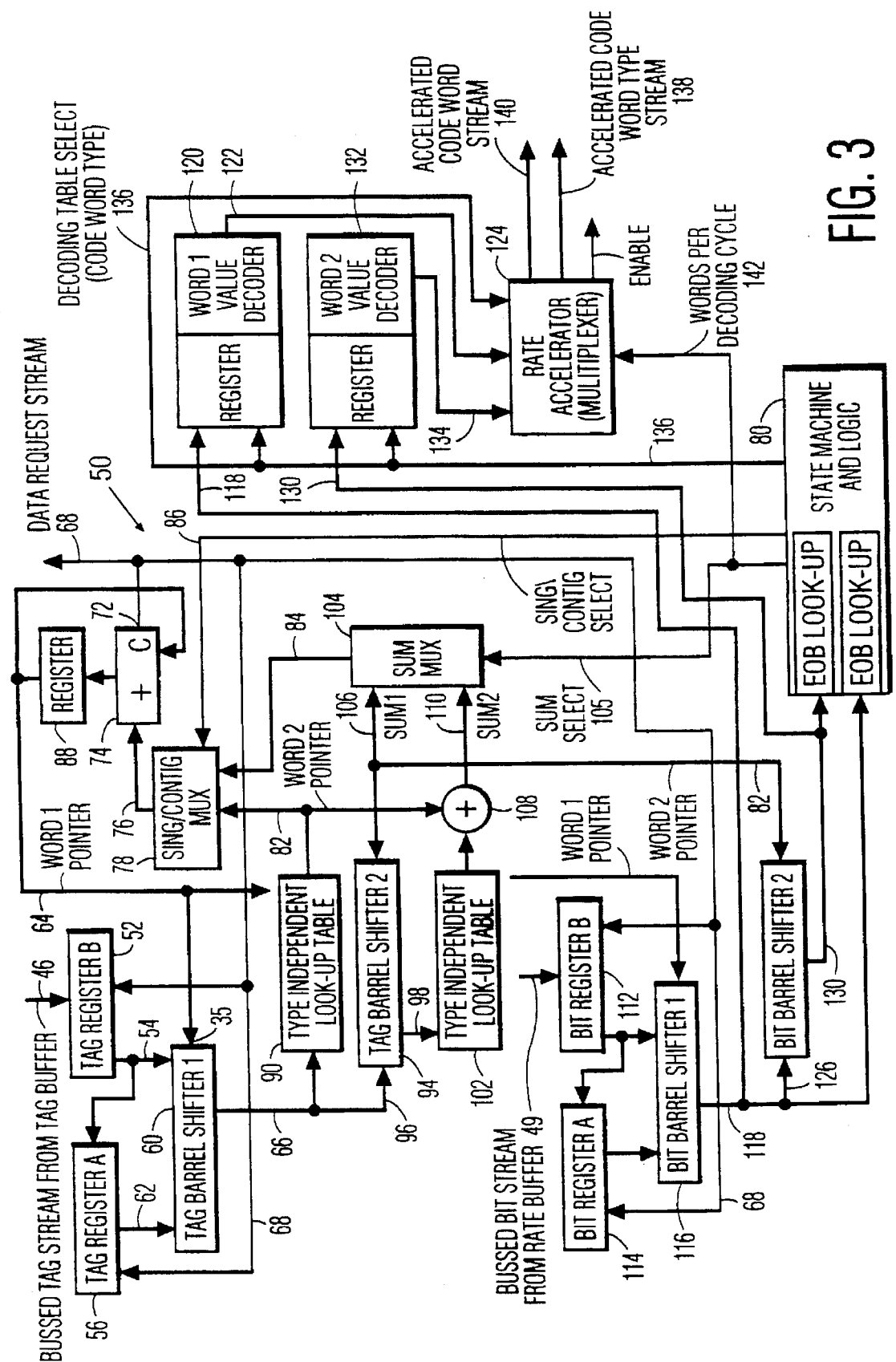
FIG. 3 is a diagram of an illustrative embodiment of the variable length decoder of the present invention, not including the pre-tagging circuit depcited in FIG. 1.
Figure 4:
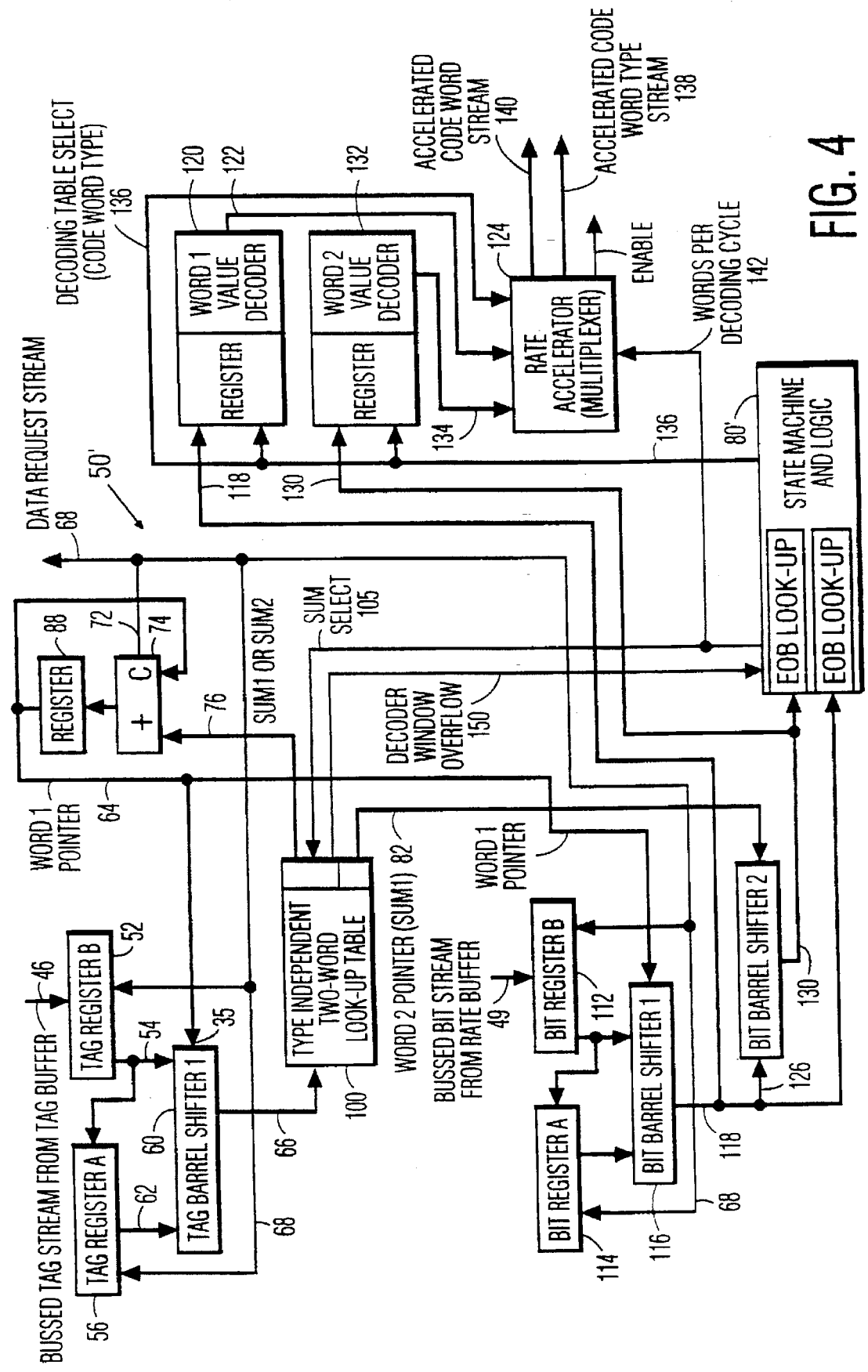
FIG. 4 is a diagram of a specific, performance-optimized embodiment of the variable length decoder of the present invention.

The output 46 of the tag buffer 38 is used in the high speed decoding circuit (shown in FIG. 3 as 50 and in FIG. 4 as 50'). A data request line 68 is shown connected to the tag buffer 38 and the rate buffer 40. The data request line 68 triggers the buffers 38, 40 to release data in response to a request from the high speed decoding circuit of the present invention (shown in FIG. 3 as 50 and FIG. 4 as 50').

FIG. 3 is a diagram of an illustrative embodiment of the variable length decoder of the present invention, not including the pre-tagging circuit depicted in FIG. 1. The operations of the variable length decoder 50 are synchronized with a clock (not shown).

The tag stream 46 is input to a first input tag register 52. Output lines 54 of the first input tag register 52 are connected to a second input tag register 56 at the input of the register 56, and are also connected to an input of a first barrel shifter 60. The second register 56 is connected to an input of the barrel shifter 60 over output lines 62. In the present specific embodiment, the first register 52 provides a sequence of thirty-two parallel bit lines 54 to the first barrel shifter 60, each line corresponding to a bit in the first register 52. The second register 56 provides a sequence of thirty-two parallel bit lines 62 to the first barrel shifter 60, each line corresponding to a bit in the second register 56. The first barrel shifter 60 has a shift input 35 and a set of thirty-two parallel output lines 66.

Those skilled in the art will appreciate that other numbers of parallel lines 54, 62 can be connected to the input of the first barrel shifter 60, and other numbers of parallel output lines 66 may be used without departing from the scope of the present invention. In the present specific embodiment, the number of parallel lines 66 is chosen to accommodate the maximum length code word to be decoded by the variable length decoder of the present invention. Typically, the number of parallel output lines 66 is no less than the maximum length code word to be decoded, or the maximum length set of code words to be decoded in parallel.

Initially, in response to a data request signal applied over the line 68, a string of bits representing tagged boundaries of code words is loaded into the first register 52 from the input tag stream 46. Once the first register 52 is loaded with bits, the contents of the first register 52 are transferred to the second register 56 via the output 54. The thirty-two parallel input bit lines 54 from the first register 52 and the thirty-two parallel input bit lines 62 from the second register 56 provide a parallel sequence of sixty-four available input bits to the first barrel shifter 60. The thirty-two parallel output lines 66 from the first barrel shifter 60 are chosen from the set of sixty-four parallel input lines 54 and 62. The thirty-two parallel output lines 66 form an output decoding window that is shifted from left to right across the sequence of available input bits in response to a word pointer applied over the line 64. The decoding window 66 is shifted by the word pointer across the sequence of available input bits so that the start of the next code word to be processed begins at the left edge of the decoding window 66. The word pointer thus determines where the left edge of the decoding window 66 is placed with respect to the sequence of available input bits.

An adder 74 has a first adder input 76, and a second adder input that is the word pointer applied over the line 64. The first adder input 76 is connected to the output of a sing/contig multiplexer 78. The output of the sing/contig multiplexer 78 and therefore the first adder input 76, is switched between a first multiplexer input 82 and a second multiplexer input 84. The switching of the output of the multiplexer 78 from the first input 82 to the second input 84 switches of the variable length decoder 50 from processing one word tag boundary at a time to processing a set of word tag boundaries at a time. The switching of the sing/contig multiplexer 78 is controlled by a control circuit 80 that provides a control mode (sing/contig select) signal over the line 86 to a control input of the multiplexer 78.

The control circuit 80 includes a state machine and associated logic circuitry for controlling the operation of the variable length decoder in accordance with a prescribed decoding protocol, e.g., an MPEG decoding protocol. The control circuit 80 determines the number and types of the code words to be decoded on the basis of the current and previously decoded code words, in accordance with the prescribed decoding protocol.

The adder 74 adds the first adder input 76 to the value of the word pointer determined in a current clock cycle, and outputs any remainder as a carry output C over the line 72 to the data request line 68. The adder 74 overflows or loops around "0" if the sum would exceed thirty-two. For example, a sum of thirty-eight is represented by six, and a sum of forty-three is represented by eleven. In both examples, the data request line 68 is activated by the carry output C applied over the line 72.

The output of the adder 74 (i.e., the updated word pointer) is connected to the input of a register 88, and the output of the register 88 is connected via the line 64 to the shift input 35 of the first barrel shifter 60.

The decoding window 66 is thirty-two bits wide in the illustrative embodiment of the variable length decoder of the present invention. A high bit at a given bit location in the decoding window 66 marks the end of the previous code word and the beginning of the next code word. For example, a high bit on the seventh bit in the decoding window 66 corresponds to the end of a code word that is seven bits long. Using this tag information, a type independent look-up table 90 can be used to easily and rapidly determine the length of a given incoming code word. As will be appreciated by those skilled in the art, the type independent look-up table 90 contains a dramatically lower number of entries than a plurality of conventional Huffman look-up tables containing all of the Huffman code word entries for each code word type. The only entries in the type independent look-up table 90 are all of the thirty-two possible tag stream bit combinations for a single code word, as will be shown and discussed hereinafter.

The decoding window 66 is connected to the type independent look-up table 90. The type independent look-up table 90 is used to look up the length of the code word whose sequence of tag stream bits begins at the left edge of the decoding window 66. The decoded length is output to the first multiplexer input 82. The input 82 will be selected as the output of the sing/contig multiplexer 78 in response to a control signal (Sing/Contig Select) supplied by the control circuit 80 over the control line 86 indicating that only one (singular) code word will be processed in the instant clock cycle.

Since the tree searching state machine 20 tags the boundaries of all code words, the decoding of word lengths can now be done regardless of the code word type using the type independent look-up table 90. For example, the length of a code word of any type can easily be determined by the type independent look-up table 90. Thus, even when processing only one code word in a clock cycle, the variable length decoder of the present invention will have an enhanced throughput relative to the presently available variable length decoders, by virtue of the speed by which the length of the code word can be decoded using the simple type independent look-up table 90.

The output 82 of the look-up table 90 is connected to the shift input of a second barrel shifter 94. The decoding window 66 is also connected to the second barrel shifter 94 over the parallel bit lines 96. A decoding window 98 of the second barrel shifter 94 is shifted from the left edge of the decoding window 96 by the length of the first detected code word. The length of the first detected code word is the output 82 of the type independent look-up table 90 which is applied as a word pointer to the shift input of the second barrel shifter 94. The decoding window 98 of the second barrel shifter 94 is connected to a second type independent look-up table 102. The second type independent look-up table 102 is used to look up the length of the code word directly following the code word whose length was determined by the type independent look-up table 90.

In order to facilitate the parallel processing of code words, a sum multiplexer 104 is provided. The length of the first detected code word applied over the line 82 connected to the output of the type independent look-up table 90 provides a first input 106 to the sum multiplexer 104. A second input 110 to the sum multiplexer 104 represents the sum of the length of the second code word output from the second type independent look-up table 102, and the length of the first code word output by the first type independent look-up table 90. The sum is computed by a second adder 108 whose output is the second input 110 to the sum multiplexer 104.

The output of the sum multiplexer 104 is the second input 84 to the sing/contig multiplexer 78. When the variable length decoder 50 is processing code words in parallel, the second input 84 of the sing/contig multiplexer 78 is the second input 110 of the sum multiplexer 104. When the second input 84 of the sing/contig multiplexer 78 is selected, the left edge of the decoding window 66 is shifted across the sequence of available input bits by the sum of the lengths of the last two processed code words. Hence, the left edge of the decoding window 66 begins a new word tag boundary sequence.

The output 84 of the sum multiplexer 104 is switched between the inputs 106, 110 in response to a sum select control signal applied over the line 105 by the control circuit 80. The control circuit 80 determines the number of code words being processed in parallel and selects the appropriate input of the sum multiplexer 104 as the output 84 of the sum multiplexer 104.

As an extension of the above-described basic inventive concept of the present invention, several more barrel shifters may be added with additional inputs to the sum multiplexer 104, and the width of the decoding window 66 may be enlarged to accommodate larger sets of code words to be processed in parallel by the variable length decoder 50.

The input bit stream 44 is input to a third register 112 whose output is connected to the input of a fourth register 114 and to the second input of a third barrel shifter 116. The operation of the circuit formed by the third register 112, the fourth register 114, and the third barrel shifter 116 is similar to the operation of the circuit formed by the first register 52, the second register 56, and the first barrel shifter 60, but with several exceptions. The input bit stream 44 is a stream of bits representing code words rather than just the tagged lengths of code words as input to the first register 52 via the input tag stream 46. A decoding window 118 of the barrel shifter 116 is simultaneously shifted with the decoding window 66, and is shifted by the same distance in bits as is the decoding window 66, in response to the word pointer applied over the line 64, which is also connected to the shift input of the barrel shifter 116.

The decoding window 118 is connected to a first word value decoder 120. The decoder 120 decodes the value of the first code word in the decoding window 118 and outputs the value of this code word to a first input 122 of an output multiplexer 124. The decoding window 118 is also connected over the parallel lines 126 to a fourth barrel shifter 128. A decoding window 130 of the fourth barrel shifter 128 is shifted to the beginning of the second code word contained in the decoding window 118 in response to the output of the type independent look-up table 90 applied over the line 82, which constitutes a word pointer applied over the line 82 to a shift input of the fourth barrel shifter 128.

The decoding window 130 is connected to a second word value decoder 132. The second word value decoder 132 decodes the value of the second code word, which is the first code word in the decoding window 130. The decoded value of this code word is output from the second value decoder 132, which is applied as a second input 134 to the output multiplexer 124.

The control circuit 80 informs the first word value decoder 120, the second word value decoder 132 and the output multiplexer 124 of the type of code word or words that are being processed via the control line 136. This information is used to select the proper decoding (look-up) tables within the value decoders 120, 132, and is also applied to an input of the output multiplexer 124. The values of the code words provided on the inputs 122, 134 are multiplexed onto an accelerated code word stream 140. Additional information about the number of code words being processed in parallel is provided to the output multiplexer 124 by the control circuit 80 via the words per decoding cycle line 142. This additional information is also used in subsequent processing operations. The output multiplexer 124 outputs the code word types as a code word type stream over the line 138, and outputs the number of code words per clock cycle over the line 142 to the next stage in the data processing system, to thereby activate (enable) the appropriate circuits in the next stage of the system.

Based on the mode of operation, (either singular or contiguous code word processing mode), and the number of available code words per clock cycle (in the contiguous code word processing mode), the control circuit 80 controls the output multiplexer (rate accelerator) 124 to provide at its output either one singular code word value or up to four contiguous code word values. Depending on system implementation, the code words can be multiplexed into a single code word stream clocked at a higher rate or written into the following memory stages (not shown) at the same rate using appropriate addressing schemes.

The third decoding window 118 and the fourth decoding window 130 are connected to the control circuit 80. When in the contiguous mode, the control circuit 80 searches for an end of a sequence or block of contiguous code words contained in the decoding windows 118, 130 by searching for sequence terminators (e.g., end of block (EOB) code words) and/or by counting motion vectors (MVs). When an end of the sequence of contiguous code words is detected, the output 86 of the control circuit 80 switches the sing/contig multiplexer 78 to the singular mode of operation. The following table (Table 1) illustrates how the length of a code word is determined from the word boundary tag stream at the output of the barrel shifter 66. The variable length decoder of the present invention employs two-path parallel processing for qualified data types such as DCT coefficients and other payload data (e.g., motion vectors) which constitute contiguous code words. The tag information supplied by the bussed tag stream 46 and used to determine word lengths represents a string of "zeros" ending with "ones" (tags) aligned with the last bit of a given word in the bussed bit stream 44. The two-path loop uses a tag stream instead of a bit stream used in previous decoders to determine word lengths. By using a tag stream, the faster type independent look up tables 90, 94 can be used. An exemplary type independent look-up table is shown in TABLE 1 below.

TABLE 1

| Code Word Length | Word Boundary Tag Stream |
|---|---|
| 1xxxxxxxxxxxxxxxxxxxxxxxxxxxxxxx | => 1 |
| 01xxxxxxxxxxxxxxxxxxxxxxxxxxxxxx | => 2 |
| 001xxxxxxxxxxxxxxxxxxxxxxxxxxxxx | => 3 |
| 0001xxxxxxxxxxxxxxxxxxxxxxxxxxxx | => 4 |
| 00001xxxxxxxxxxxxxxxxxxxxxxxxxxx | => 5 |
| 000001xxxxxxxxxxxxxxxxxxxxxxxxxx | => 6 |
| 0000001xxxxxxxxxxxxxxxxxxxxxxxxx | => 7 |
| 00000001xxxxxxxxxxxxxxxxxxxxxxxx | => 8 |
| 000000001xxxxxxxxxxxxxxxxxxxxxxx | => 9 |
| 0000000001xxxxxxxxxxxxxxxxxxxxxx | => 10 |
| 00000000001xxxxxxxxxxxxxxxxxxxxx | => 11 |
| 000000000001xxxxxxxxxxxxxxxxxxxx | => 12 |
| 0000000000001xxxxxxxxxxxxxxxxxxx | => 13 |
| 00000000000001xxxxxxxxxxxxxxxxxx | => 14 |
| 000000000000001xxxxxxxxxxxxxxxxx | => 15 |
| 0000000000000001xxxxxxxxxxxxxxxx | => 16 |
| 00000000000000001xxxxxxxxxxxxxxx | => 17 |
| 000000000000000001xxxxxxxxxxxxxx | => 18 |
| 0000000000000000001xxxxxxxxxxxxx | => 19 |
| 00000000000000000001xxxxxxxxxxxx | => 20 |
| 000000000000000000001xxxxxxxxxxx | => 21 |
| 0000000000000000000001xxxxxxxxxx | => 22 |
| 00000000000000000000001xxxxxxxxx | => 23 |
| 000000000000000000000001xxxxxxxx | => 24 |
| 0000000000000000000000001xxxxxxx | => 25 |
| 00000000000000000000000001xxxxxx | => 26 |
| 000000000000000000000000001xxxxx | => 27 |
| 0000000000000000000000000001xxxx | => 28 |
| 00000000000000000000000000001xxx | => 29 |
| 000000000000000000000000000001xx | => 30 |
| 0000000000000000000000000000001x | => 31 |
| 00000000000000000000000000000001 | => 0 |

FIG. 4 is a block diagram of a specific embodiment of the variable length decoder of FIG. 3. The operation of the variable length decoder of this specific embodiment is similar to the operation of the variable length decoder of the embodiment depicted in FIG. 3, with the following exceptions. Several circuit components of the variable length decoder depicted in FIG. 3: the look-up table 90, the barrel shifter 94, the type independent look-up table 102, the adder 108, the sing/contig multiplexer 78, and the sum multiplexer 104 are logically combined in FIG. 4 into a single two code word type independent look-up table 100. The type independent look-up table 100 can also detect the lengths of code words independent of the type of code words being processed. The following tabel (Table 2) illustrates the word boundary tag stream in the decoding window 66 of the first barrel shifter 60. The length of the first code word is decoded and is labeled in Table 2 as Sum1. The sum of the lengths of both code words is decoded and is labeled in Table 2 as Sum 2. The appropriate sum is selected by the control circuit 80' via the sum select control signal applied over the line 105, and output to the first input 76 of the adder 74.

TABLE 2

| WORD BOUNDARY TAG STREAM | SUM1 | SUM2 | OVER-FLOW |
|---|---|---|---|
| 11xxxxxxxxxxxxxxxxxxxxxxxxxxxxxx | 1 | 2 | 0 |
| 101xxxxxxxxxxxxxxxxxxxxxxxxxxxxx | 1 | 3 | 0 |
| 1001xxxxxxxxxxxxxxxxxxxxxxxxxxxx | 1 | 4 | 0 |
| 10000000000000000000000000000001 | 1 | 32 | 0 |
| 10000000000000000000000000000000 | 1 | 1 | 1 |
| 011xxxxxxxxxxxxxxxxxxxxxxxxxxxxx | 2 | 3 | 0 |
| 0101xxxxxxxxxxxxxxxxxxxxxxxxxxxx | 2 | 4 | 0 |
| 01001xxxxxxxxxxxxxxxxxxxxxxxxxxx | 2 | 5 | 0 |
| 01000000000000000000000000000001 | 2 | 32 | 0 |
| 01000000000000000000000000000000 | 2 | 2 | 1 |

TABLE 2-continued

| WORD BOUNDARY TAG STREAM | SUM1 | SUM2 | OVER-FLOW |
|---|---|---|---|
| 0011xxxxxxxxxxxxxxxxxxxxxxxxxx0 | 3 | 4 | 0 |
| . | . | . | . |
| . | . | . | . |
| . | . | . | . |
| 000000000000000000000000000101 | 30 | 32 | 0 |
| 000000000000000000000000000100 | 30 | 30 | 1 |
| 000000000000000000000000000011 | 31 | 32 | 0 |
| 000000000000000000000000000010 | 31 | 31 | 1 |
| 000000000000000000000000000001 | 32 | 32 | 1 |

In the above table, the length of the first code word is determined by the first "high" bit after an uninterrupted series of "low" bits. Each of the cases for the same length of the first code word is expanded into a limited number of possibilities for the length of the second word. If the end of the second code word is not found in the decoding window 66 by the look-up table 100, an overflow bit is output from the look-up table 100 to the control circuit 80 via the overflow line 150. This overflow mechanism allows the decoding window 66 to be narrower than the length of two maximum length code words. This design option is in agreement with the fact that very high throughputs are only required if the bit stream contains a large number of short code words. The sum of the first code word Sum 1 is generated at the sum select output 105 output unconditionally. The sum of the first and second code words Sum 2 is assigned to the value of Sum 1 in the case of overflow, or under control of the "Sum Select" control signal from the control circuit 80.

In the event of overflow, the overflow bit applied over the line 150 notifies the control circuit 80' that the second code word was not detected. The control circuit 80' then chooses the Sum 1 via the sum select output line 105. The decoding window 66 is then shifted by the length of the first code word as represented by Sum 1 on the output line 76. Now, the length of the second code word can be detected as long as its length in bits is less than the width of the output decoding window 66. By handling overflow, the type independent look-up table 100 can have a decoding window that is narrower than the length of the sum of two maximum length code words. This is also true when larger numbers of code words are being processed in parallel. Since very high throughputs are only required if the variable length decoder must decode a large number of short code words, implementing a narrow decoding window is a viable design option. The sum select output 105 is also used to select only one code word if necessary during a contiguous mode of operation.

The performance-optimized variable length decoder depicted in FIG. 4 has a much higher throughput than the variable length decoder depicted in FIG. 3 and the variable length decoder disclosed in U.S. Pat. No. 5,173,695, issued to Sun et al., due to the dramatic reduction in propagation delays which is achieved with the use of the high-speed length decoding loop described hereinabove.

Due to the pre-tagging of the input bit stream, the use of the type independent look-up table 100 is possible. Since the type independent look-up table 100 does not differentiate between code word types, different types of code words, such as DC and AC coefficients, may be processed with full throughput, and without any interruptions in the decoding process.

FIG. 5 is a diagram illustrating the number of code words processed per clock cycle for an exemplary sequence of input code words. FIG. 5 illustrates an exemplary data stream which includes four blocks of discrete cosine transform coefficients (DCT). With the variable length decoder of FIG. 3 or FIG. 4, two code words are processed per clock cycle regardless of the types of code words present in the input bit stream, and the sequence in which they occur. The variable length decoder of FIG. 3 or FIG. 4 may be constructed to process larger sequences of code words per clock cycle.

Parallel processing is used in the first through the ninth clock cycles. DC coefficients as well as AC coefficients are processed together in the contiguous code word decoding loop because their decoding table 100 is type indepentent. Although the code word EOB is processed in the contiguous code word decoding loop, the EOB is the only code word remaining in the macroblock before a possible sequence of non-qualifying data types starts. Only the clock cycle in the very end of a macro block may potentially have non-enhanced throughput. Thus, the DCT coefficient block sequence is processed by the variable length decoder of the present invention in only ten clock cycles.

FIG. 6 is a diagram illustrating the number of code words processed per clock cycle utilizing a conventional variable length decoder constructed in accordance with the teachings of U.S. Pat. No. 5,173,695 to Sun et al. for the same exemplary sequence of input code words. The variable length decoder of U.S. Pat. No. 5,173,695 may process only one code word per clock cycle as shown in FIG. 6. Thus, the DCT coefficient block sequence is processed by the conventional variable length decoder in nineteen clock cycles.

The variable length decoder disclosed in the co-pending U.S. patent application entitled "Variable Length Decoder with Enhanced Throughput due to Parallel Processing of Contiguous Code Words of Identical Type," by M. Bakhmutsky, allows more than one code word of a certain type to be processed by the variable length decoder in a given clock cycle, thereby enhancing the data throughput at a lower clock rate. The above-referenced patent application discloses a variable length decoder that utilizes the fact that payload data such as DCT coefficients and Motion Vectors are usually very well defined by header data in terms of their location and volume in the bit stream. For example, in MPEG-2, the number of motion vectors is known before the motion vectors are transmitted. DCT coefficients are normally organized in blocks and the number of blocks is known. End of block (EOB) code words called terminators are part of a DCT coefficient table. DCT coefficients and motion vectors do not significantly affect the routing of the decoding process, and are very predictable. This and the fact that DCT coefficients and motion vectors (qualified data types) are transmitted in long sequences which are easy to distinguish from other types of information allow for their quasi-parallel processing as described in the above-referenced patent application.

In the above-referenced patent application entitled "Variable Length Decoder with Enhanced Throughput due to Parallel Processing of Contiguous Code Words of Identical Type," the qualified dam types to be processed in parallel are interrupted by singular data types which have to be processed in the singular mode of operation. Unfortunately, singular type code words must be processed differently than the qualified contiguous type code words, thereby resulting in throughput reduction. For example, in the four path contiguous loop described in the above-referenced patent application, contiguous code words such as AC coefficients are interrupted at the start of a new coefficient block, which begins with a DC coefficient code word, which is encoded differently than the contiguous AC coefficients. Therefore, the DC coefficients do not qualify for parallel processing (i.e., they are singular code words), and are therefore processed in the singular code word decoding loop. Each time the decoding process is switched from the contiguous mode to the singular mode, the throughput is reduced. The throughput is further reduced by virtue of the fact that less than four AC coefficients might be processed in the last clock cycle of the previous block. This is because the number of AC coefficients is not guaranteed to be divisible by four, and thus, the number of remaining AC coefficients in the end of the block including the EOB code word can be anything from one to four. Hence, the throughput per clock cycle is less than the number of paths used in the design.

FIG. 7 is a diagram illustrating the number of code words processed per clock cycle for the same exemplary sequence of input code words utilizing a variable length decoder constructed in accordance with the teachings of the co-pending U.S. patent application entitled "Variable Length Decoder with Enhanced Throughput due to Parallel Processing of Contiguous Code Words of Identical Type," by M. Bakhmutsky. In FIG. 7, a maximum of two code words per clock cycle are processed for a variable length decoder with two parallel processing paths.

Parallel processing is not used in the first clock cycle because DC coefficients are decoded differently than AC coefficients. More particularly, DC coefficients are processed in the singular mode of operation with a throughput of one DC coefficient per clock cycle. In the second clock cycle, the coefficients AC1 and AC2 are processed in parallel, since they are contiguous (qualifying) code words. Similarily, in the third clock cycle, the coefficinets AC3 and AC4 are processed in parallel. In the fourth clock cycle, the EOB symbol is processed in the contiguous mode of operation, but due to the transition to the new code word type, i.e. the DC coefficient, only one code word is processed in the fourth clock cycle. Similarly, in other DCT blocks, only in the sixth, eighth, eleventh, and twelveth clock cycles are AC coefficients processed with enhanced throughput. In all other clock cycles, the throughput is not enhanced for one of two reasons: parallel processing is interrupted due to transition to a new code word type (X), or parallel processing does not apply because the code word is not processed in the contiguous loop (O). The DCT coefficient block is processed by this variable length decoder in thirteen clock cycles as compared to ten clock cycles for the variable length decoder of the present invention.

The advantage of the variable length decoder of the present invention over the variable length encoder disclosed in the above-referenced patent application is based on the enhanced functionality afforded by using a multi-word type independent look-up table 100, since the word length decoding operation using such a multi-word type independent look-up table is much easier and faster. In addition, a high degree of parallelism is achieved because more qualifying code words in the code word sequence are processed with higher throughput per clock cycle. Thus, reduced propagation delays in the word length decoding loop and parallel processing of code words enhances the performance of the present invention with respect to previously known variable length decoders.

Although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A variable length decoder with enhanced throughput due to pre-tagging an input bit stream which includes contiguous and singular code words, and parallel processing of contiguous code words in the input bit stream, comprising:

tagging means for receiving the input bit stream and outputting a tagged bit stream with marked code word boundaries and a bussed bit stream aligned in time with said tagged bit stream;

first input means for receiving said tagged bit stream and providing a first tag decoding window that includes a sequence of tag stream bits which include marked code word boundaries for one or more code words to be decoded at an output thereof;

second input means for receiving said bussed bit stream and providing a first bit stream decoding window that includes a sequence of bussed bit stream bits which include one or more code words to be decoded at an output thereof;

word length computation means for computing the combined length of said one or more code words in said first tag decoding window; and, code word value decoding means for determining, in parallel, the values of one or more contiguous code words in said first bit stream decoding window, during a first clock cycle, and for determining the value of a singular code word in said first bit stream decoding window during a second clock cycle.

2. The variable length decoder as set forth in claim 1, wherein said tagging means includes:

a tree searching state machine for receiving the input bit stream and for outputting a word boundary tag stream;

a first format converter for converting said word boundary tag stream from a serial bit stream to a parallel bit stream, and producing said tagged bit stream; and, a tag buffer for storing said tagged bit stream in response to a first value of a buffer control signal, and for outputting said tagged bit stream in response to a second value of said buffer control signal.

3. The variable length decoder as set forth in claim 2, wherein said tagging means further includes:

a delay equalizer for receiving the input bit stream and outputting a delay equalized bit stream delayed by a time delay between the input bit stream and said word boundary tag stream, so that said delay equalized bit stream is aligned in time with said word boundary tag stream;

a second format converter for converting said delay equalized bit stream from a serial bit stream to a parallel bit stream, and producing said bussed bit stream; and, a rate buffer for storing said bussed bit stream in response to said first value of said buffer control signal, and outputting said bussed bit stream in response to said second value of said control signal.

4. The variable length decoder as set forth in claim 1, further comprising control means for controlling the operation of the variable length decoder, in accordance with a prescribed decoding protocol, to produce an output stream of decoded code words.

5. The variable length decoder as set forth in claim 1, wherein said first input means includes:

a first tag register for receiving said tagged bit stream, and for outputting a first parallel sequence of tag stream input bits;

a second tag register coupled to an output of said first tag register, and for outputting a second parallel sequence of tag stream input bits;

a first tag barrel shifter having an input coupled to said first and second parallel sequences of tag stream input bits, to thereby provide a parallel sequence of available tag stream input bits equal in number to the total of said first and second parallel sequences of tag stream input bits, and for providing said first decoding window at an output thereof; and, wherein said first tag decoding window is shifted in response to a first word pointer across said sequence of available tag stream input bits.

6. The variable length decoder as set forth in claim 5, wherein said second input means includes:

a first bit register for receiving said bussed bit stream, and for outputting a first parallel sequence of bit stream input bits;

a second bit register coupled to an output of said first bit register, and for outputting a second parallel sequence of bit stream input bits;

a first bit barrel shifter having an input coupled to said first and second parallel sequences of bit stream input bits, to thereby provide a parallel sequence of available bit stream input bits equal in number to the total of said first and second parallel sequences of bit stream input bits, and for providing said first bit stream decoding window at an output thereof; and, wherein said first bit stream decoding window is shifted in response to said first word pointer across said sequence of available bit stream input bits.

7. The variable length decoder as set forth in claim 6, wherein said second input means further includes a second bit barrel shifter connected to said first bit stream decoding window, and providing a second bit stream decoding window at an output thereof, said third decoding window being shifted across said second decoding window in response to a second word pointer.

8. The variable length decoder as set forth in claim 7, wherein said code word value decoding means includes a first code word value decoder connected to said second decoding window, and a second code word value decoder connected to said second bit stream decoding window.

9. The variable length decoder as set forth in claim 8, further comprising an output multiplexer having a first input coupled to an output of said first code word value decoder, and a second input coupled to an output of said second code word value decoder.

10. The variable length decoder as set forth in claim 9, wherein said word length computation means includes:

a first type independent look-up table containing tag word entries which are independent of code word type, and connected to said first tag decoding window, for producing said second word pointer;

a second tag barrel shifter connected to said first tag decoding window and having a second tag decoding window which is shifted across said first tag decoding window in response to said second word pointer; and, a second type independent look-up table containing tag word entries which are independent of code word type, and connected to said second tag decoding window, for producing a third word pointer.

11. The variable length decoder as set forth in claim 10, further comprising a word length summing circuit for summing said second and third word pointers and producing a combined word length signal indicative of said combined length of said one or more code words in said first tag decoding window.

12. The variable length decoder as set forth in claim 11, further comprising a sum multiplexer having a first input coupled to said second word pointer, and a second input coupled to said combined word length signal.

13. The variable length decoder as set forth in claim 12, further comprising a sing/contig multiplexer having a first input coupled to said second word pointer, and a second input coupled to an output of said sum multiplexer.

14. The variable length decoder as set forth in claim 13, further comprising a control circuit for generating a sum select control signal and a sing/contig select control signal whose values are indicative of the number and type of code words to be decoded in a given clock cycle.

15. The variable length decoder as set forth in claim 14, wherein said second word pointer or said combined word length signal are selected as said output of said sum multiplexer in response to said sum select control signal.

16. The variable length decoder as set forth in claim 15, wherein said second word pointer or said output of said sum multiplexer is selected as an output of said sing/contig multiplexer in response to said sing/contig select control signal.

17. The variable length decoder as set forth in claim 16, further comprising an adder having a first input coupled to said output of said sing/contig multiplexer, and a second input coupled to an output of said adder which comprises said first word pointer.

18. The variable length decoder as set forth in claim 17, wherein said adder generates a carry output for requesting a new sequence of tag stream bits to loaded into said first tag register and the contents of said first tag register transferred to said second tag register, and a new sequence of bit stream bits to be loaded into said first bit register and the contents of said first bit register transferred to said second bit register.

19. The variable length decoder as set forth in claim 1, wherein:

said input bit stream is a digital video data stream;

said singular code words comprise setup data in said digital video data stream; and, said contiguous code words comprise payload data in said digital video data stream.

20. The variable length decoder as set forth in claim 1, wherein said word length computation means comprises a type independent two-word look-up table containing tag entries for two code words, and connected to said first tag decoding window.

21. A method for decoding an input bit stream which includes a plurality of singular and contiguous code words, comprising the steps of:

tagging the input bit stream and outputting a tagged bit stream with marked code word boundaries and a bussed bit stream aligned in time with said tagged bit stream;

receiving said tagged bit stream and providing a first tag decoding window that includes a sequence of tag stream bits which include marked code word boundaries for one or more code words to be decoded at an output thereof;

receiving said bussed bit stream and providing a bit stream decoding window that includes a sequence of bussed bit stream bits which include one or more code words to be decoded at an output thereof;

computing the combined length of said one or more code words in said first tag decoding window; and, determining, in parallel, the values of one or more contiguous code words in said bit stream decoding window, during a first clock cycle, and determining the value of a singular code word in said bit stream decoding window during a second clock cycle.

22. The method as set forth in claim 21, wherein the computing step is performed using a two-word type independent look-up table which contains tag word entries which are independent of code word type, for two code words.

23. The method as set forth in claim 21, wherein the computing step is performed using a first type independent look-up table connected to said first tag decoding window, and using a second type independent look-up table connected to a second tag decoding window formed at the output of a tag barrel shifter connected to said first tag decoding window.

24. The method as set forth in claim 21, wherein:

said input bit stream is a digital video data stream;

said singular code words comprise setup data in said digital video data stream; and, said contiguous code words comprise payload data in said digital video data stream.

25. A variable length decoder with enhanced throughput due to pre-tagging an input bit stream which includes contiguous and singular code words, and parallel processing of contiguous code words in the input bit stream, comprising:

a tagging circuit for receiving the input bit stream and outputting a tagged bit stream with marked code word boundaries and a bussed bit stream aligned in time with said tagged bit stream;

a first input circuit for receiving said tagged bit stream and providing a first tag decoding window that includes a sequence of tag stream bits which include marked code word boundaries for one or more code words to be decoded at an output thereof;

a second input circuit for receiving said bussed bit stream and providing a first bit stream decoding window that includes a sequence of bussed bit stream bits which include one or more code words to be decoded at an output thereof;

a word length computation circuit for computing the combined length of said one or more code words in said first tag decoding window; and, a code word value decoding circuit for determining, in parallel, the values of one or more contiguous code words in said first bit stream decoding window, during a first clock cycle, and for determining the value of a singular code word in said first bit stream decoding window during a second clock cycle.

* * * * *